United States Patent
Bu et al.

(10) Patent No.: US 9,947,748 B2
(45) Date of Patent: Apr. 17, 2018

(54) DIELECTRIC ISOLATED SIGE FIN ON BULK SUBSTRATE

(71) Applicant: INTERNATIONAL BUSINESS MACHINES CORPORATION, Armonk, NY (US)

(72) Inventors: Huiming Bu, Millwood, NY (US); Shogo Mochizuki, Clifton Park, NY (US); Tenko Yamashita, Schenectady, NY (US)

(73) Assignee: International Busines Machines Corporation, Armonk, NY (US)

( * ) Notice: Subject to any disclaimer, the term of this patent is extended or adjusted under 35 U.S.C. 154(b) by 0 days.

(21) Appl. No.: 15/406,218

(22) Filed: Jan. 13, 2017

(65) Prior Publication Data

US 2017/0133463 A1  May 11, 2017

Related U.S. Application Data

(63) Continuation of application No. 14/876,245, filed on Oct. 6, 2015, now Pat. No. 9,595,599.

(51) Int. Cl.
| | | |
|---|---|---|
| *H01L 21/336* | (2006.01) | |
| *H01L 29/10* | (2006.01) | |
| *H01L 29/66* | (2006.01) | |
| *H01L 21/762* | (2006.01) | |
| *H01L 21/3065* | (2006.01) | |
| *H01L 21/308* | (2006.01) | |
| *H01L 29/161* | (2006.01) | |
| *H01L 29/78* | (2006.01) | |
| *H01L 29/06* | (2006.01) | |

(52) U.S. Cl.
CPC ........ *H01L 29/1054* (2013.01); *H01L 21/308* (2013.01); *H01L 21/3065* (2013.01); *H01L 21/76224* (2013.01); *H01L 29/0653* (2013.01); *H01L 29/161* (2013.01); *H01L 29/66795* (2013.01); *H01L 29/7851* (2013.01)

(58) Field of Classification Search
CPC .................. H01L 29/6681; H01L 29/785
See application file for complete search history.

(56) References Cited

U.S. PATENT DOCUMENTS

| | | |
|---|---|---|
| 8,048,723 B2 | 11/2011 | Chang et al. |
| 8,106,459 B2 | 1/2012 | Chang et al. |
| 8,658,504 B2 | 2/2014 | Sudo |
| 8,703,565 B2 | 4/2014 | Chang et al. |
| 8,866,204 B2 | 10/2014 | Liu et al. |
| 8,969,155 B2 | 3/2015 | Cheng et al. |

(Continued)

OTHER PUBLICATIONS

List of IBM Patents or Patent Applications Treated as Related dated Jan. 13, 2017, 2 pages.

*Primary Examiner* — Daniel Shook
(74) *Attorney, Agent, or Firm* — Tutunjian & Bitetto, P.C.; Vazken Alexanian

(57) ABSTRACT

A method for forming fins on a semiconductor device includes etching trenches into a monocrystalline substrate to form first fins and forming a first dielectric layer at bottoms of the trenches. Second fins of a material having a different composition than the substrate are grown on sidewalls of the trenches. A second dielectric layer is formed over the second fins. The first fins are removed by etching. The second fins are processed to form fin field effect transistor devices.

13 Claims, 6 Drawing Sheets

(56) References Cited

U.S. PATENT DOCUMENTS

| | | |
|---|---|---|
| 8,975,125 B2 | 3/2015 | Adam et al. |
| 9,029,913 B2 | 5/2015 | Utomo et al. |
| 9,595,599 B1 * | 3/2017 | Bu .................... H01L 29/6681 |
| 2013/0221491 A1 | 8/2013 | Wann et al. |
| 2013/0256759 A1 * | 10/2013 | Vellianitis ............ H01L 29/785 |
| | | 257/200 |
| 2015/0001591 A1 | 1/2015 | Akarvardar et al. |
| 2015/0021691 A1 | 1/2015 | Akarvardar et al. |

* cited by examiner

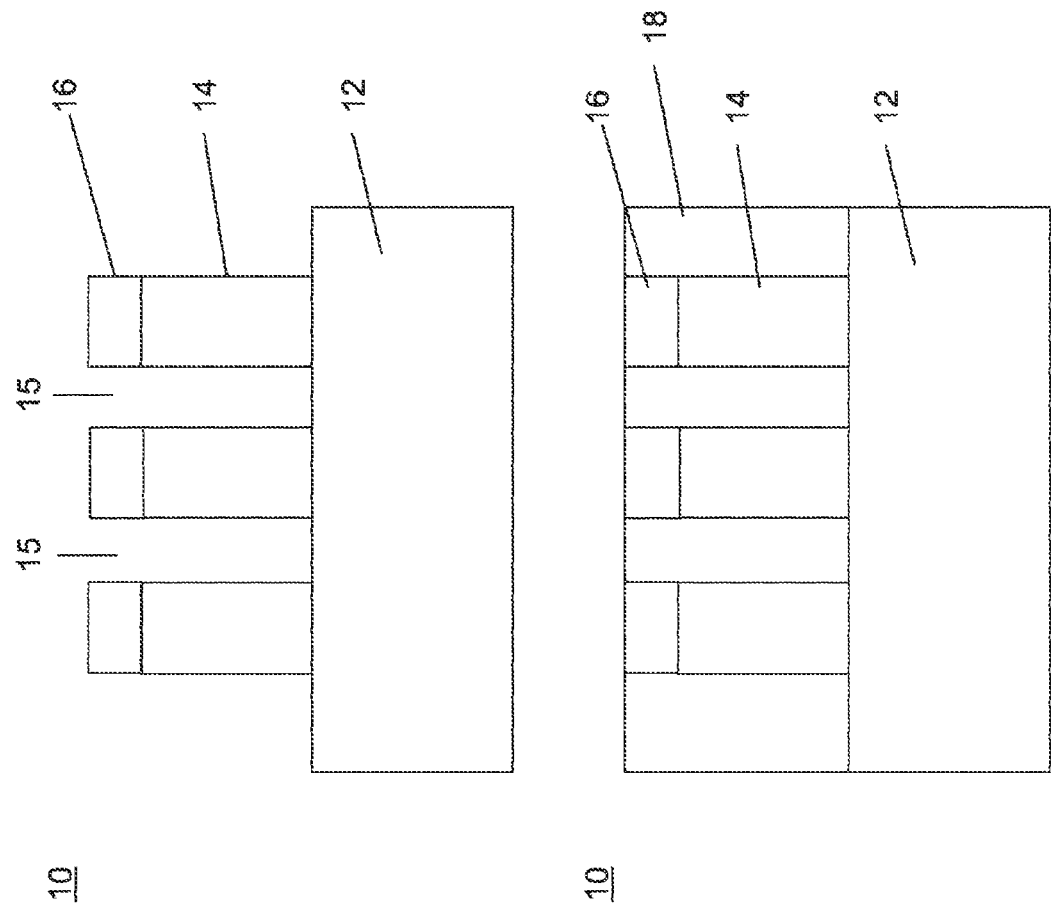

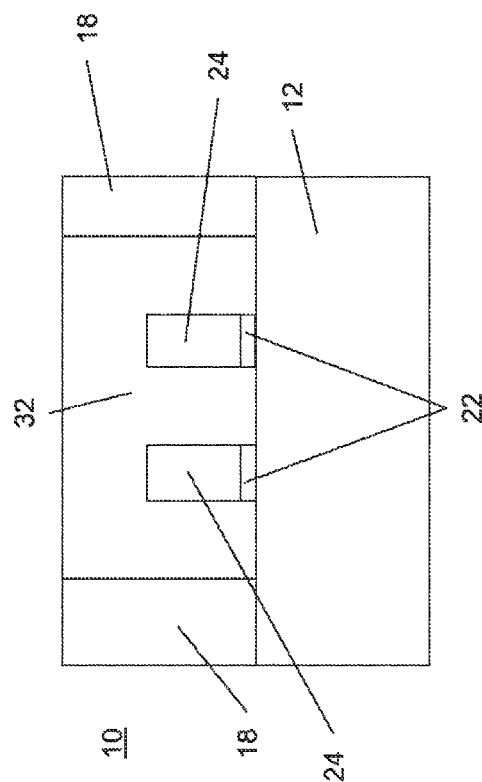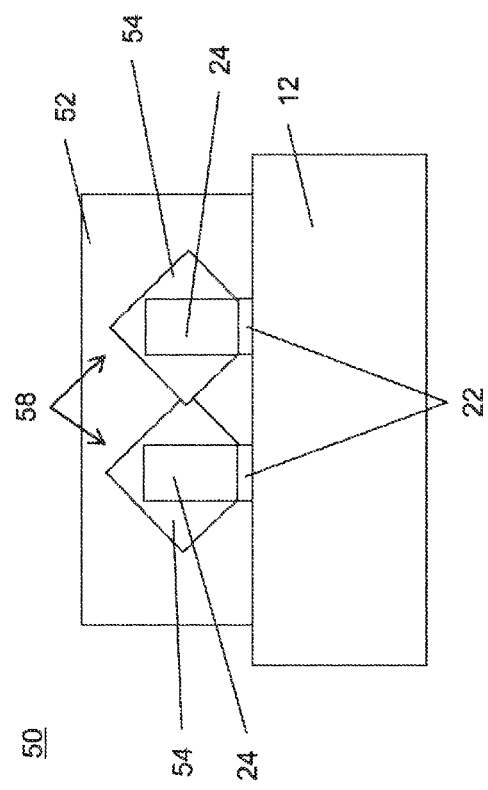

US 9,947,748 B2

DIELECTRIC ISOLATED SIGE FIN ON BULK SUBSTRATE

BACKGROUND

Technical Field

The present invention relates to semiconductor processing, and more particularly to devices and methods for forming high concentration SiGe fins on a dielectric layer.

Description of the Related Art

Many semiconductor devices employ fin structures for the formation of the field effect transistors (finFETs). N-type field effect transistors (NFETs) are formed in silicon and P-type field effect transistors (PFETs) are formed in SiGe material.

In some instances, the use of SiGe fins is advantageous due to improved mobility; however, SiGe structures formed epitaxially may be limited by critical thickness. For example, if the thickness of the epitaxial layer is kept small enough to maintain its elastic strain energy below an energy of dislocation formation (defects), the strained-layer structure will be thermodynamically stable against dislocation formation. To maintain a defect free epitaxial layer, the thickness of the layer is limited.

In conventional fin formation processes, Ge condensation is employed to provide high concentration Ge in SiGe fins. A bulk silicon substrate is etched to form fins and SiGe cladding is grown on fin regions exposed through a shallow trench isolation (STI) layer. The SiGe cladding is faceted in shape. The SiGe is then buried in oxide and annealed at high temperatures (e.g., 900-1000 degrees C.) to drive in the Ge into the fins from the cladding. The annealing may be performed in multiple cycles.

The fin profile (shape) is affected by the annealing process and the faceted SiGe cladding epitaxial morphology. In addition, the Ge diffusion into the fin channel region/substrate and punch through stopper (PTS) dopant (e.g., As/P) diffusion into the fin channel region due to high thermal budget may impact mobility in the fin channel.

SUMMARY

A method for forming fins on a semiconductor device includes etching trenches into a monocrystalline substrate to form first fins and forming a first dielectric layer at bottoms of the trenches. Second fins of a material having a different composition than the substrate are grown on sidewalls of the trenches. A second dielectric layer is formed over the second fins. The first fins are removed by etching. The second fins are processed to form fin field effect transistor devices.

Another method for forming fins on a semiconductor device includes patterning a hardmask on a monocrystalline substrate; etching trenches in the substrate through the hardmask to form first fins; forming a first dielectric layer over the hardmask and in the trenches; planarizing the first dielectric layer and stopping on the hardmask; recessing the first dielectric layer into the trenches to form a dielectric pad at a bottom of the trenches and to expose sidewalls of the first fins; growing second fins of a material having a different composition than the substrate on the sidewalls of the trenches; forming a second dielectric layer over the second fins; planarizing the second dielectric layer and stopping on the hardmask; removing the hardmask; removing the first fins by etching; and processing the second fins to form fin field effect transistor devices.

A semiconductor device includes a monocrystalline substrate and defect free and monocrystalline SiGe fins grown laterally using the substrate as a seed layer. A dielectric pad is formed between a footprint of each fin and the substrate to provide electrical isolation between the fins and the substrate, the fins forming a channel for fin field effect transistor devices.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 1 is a cross-sectional view of a partially fabricated semiconductor device showing a hardmask and trenches formed in a substrate by an etching process in accordance with the present principles;

FIG. 2 is a cross-sectional view of the partially fabricated semiconductor device of FIG. 1 showing a first dielectric layer formed in the trenches and planarized in accordance with the present principles;

FIG. 9 is a cross-sectional view of the partially fabricated semiconductor device of FIG. 8 showing a dielectric fill to form a shallow trench isolation region for the fins in accordance with the present principles;

FIG. 10 is a cross-sectional view of the partially fabricated semiconductor device of FIG. 9 showing a gate structure and source and drain regions formed in accordance with the present principles.

DETAILED DESCRIPTION

Figure 3:
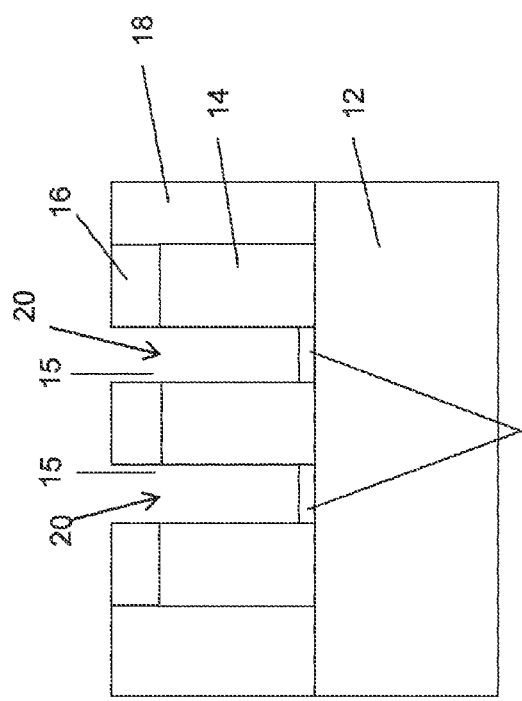
FIG. 3 is a cross-sectional view of the partially fabricated semiconductor device of FIG. 2 showing the first dielectric layer recessed in the trenches to form a dielectric pad in accordance with the present principles.

In accordance with the present principles, devices and methods are provided for forming fin field effect transistors (finFETs) which employ a high concentration of germanium in the fins (e.g., for p-type field effect transistors (PFETs) although similar processing may be employed for n-type field effect transistors (NFETs)). In one embodiment, fins are etched into a bulk substrate. A dielectric layer is formed in trenches between the fins and recessed to expose the sidewalls of the fins. A SiGe material is selectively grown, e.g., epitaxially in the trenches on sidewalls of the fins. The SiGe material has its dimensions controlled by the size of the trench in which it is formed. In addition, the height of the SiGe material may be etched and recessed to a desired fin height.

Since the SiGe is epitaxially grown on sidewalls of Si fins, the SiGe includes a monocrystalline structure with no defects. In addition, the fin pitch can be increased (e.g., doubled) without employing aggressive patterning solutions, such as, e.g., lithography, etch, lithography, etch (LELE) processes. There is no fin height restriction in accordance with the present principles.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a partially fabricated semiconductor device 10 is illustratively shown in cross-section. A fin 14 (or an array of parallel fins) is formed from a monocrystalline material, such as monocrystalline Si. The fin 14 may be patterned from a bulk substrate 12. Bulk substrate 12 preferably includes monocrystalline Si although other materials may be provided. A hardmask 16 is formed on the substrate 12 and is patterned using lithography or sidewall image transfer (SIT) processing. The hardmask 16 includes a dielectric material and may include a nitride or oxide. In one particularly useful embodiment, the hardmask 16 includes silicon nitride.

The hardmask 16 is patterned to form the fins 14 by an etch process. The etch process may include a reactive ion etch (RIE). In addition, trenches 15, formed between the fins 14, include a width that will be employed as a channel width for fins to be formed later in the processing. For example, the fins to be formed may include a width as defined by the trenches 15.

It should be noted that the fins 14 may be formed in areas of the device 10 that are designated for NFET devices. The fins 14 may also be employed for PFET fins.

Referring to FIG. 2, the trenches 15 are filled with a dielectric fill material 18. The dielectric fill material 18 may include an oxide. The dielectric fill material 18 may be deposited using a chemical vapor deposition (CVD) process although any suitable deposition process may be employed.

The dielectric fill material 18 is planarized to remove excess material. The planarization process may include a chemical mechanical polish (CMP) process. The CMP process stops on the hardmask 16.

Referring to FIG. 3, the dielectric fill 18 is exposed to an etch process to recess the dielectric fill 18 to a height below a top region of the fins 14. A recess 20 is formed between the fins 14. The recessing process may include a lithographic patterning to recess the dielectric layer 22 in certain areas only.

The recess process forms a thin dielectric layer 22 at a bottom of the trench 15. The dielectric layer 22 will provide electrical isolation for the fins to be formed. The dielectric layer 22 may have a thickness of between about 5 nm and about 50 nm depending on the technology and application. The recess 20 formation exposes sidewalls of the fins 14.

Figure 4:
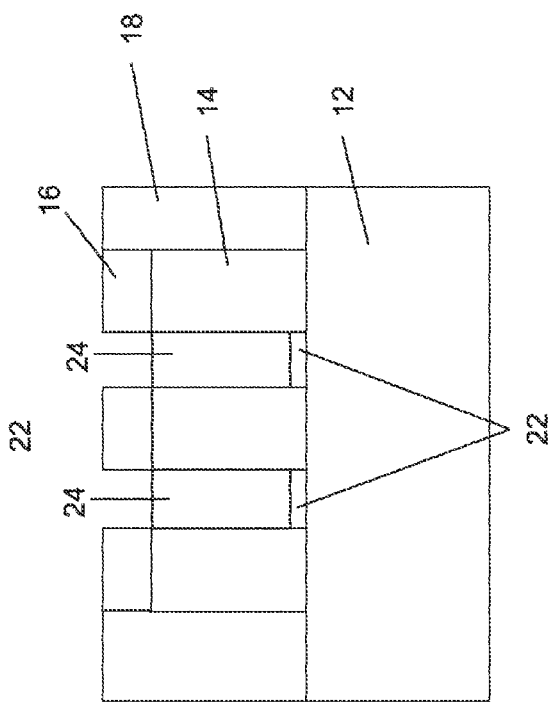
FIG. 4 is a cross-sectional view of the partially fabricated semiconductor device of FIG. 3 showing second fins (e.g., SiGe) formed using sidewalls of the first fins as a seed layer in accordance with the present principles.

Referring to FIG. 4, exposed sidewalls of the fins 14 are employed to epitaxially grow fins 24. The fins 24 may be formed with un-doped epitaxial materials. In one embodiment, the fins 24 include SiGe or other suitable materials. The fins 24 are monocrystalline and grown to be defectless. During the epitaxially growth process a concentration of Ge is provided. The Ge concentration may be between about 50% and about 100%. Other Ge concentrations may also be employed. Since the fin 24 is confined within the fins 14, the dimensions of the fins 24 are well-controlled.

The epitaxial growth process to form fins 24 may include a molecular beam epitaxy (MBE) or a chemical vapor deposition (CVD) process, although other processes may be employed.

Figure 5:
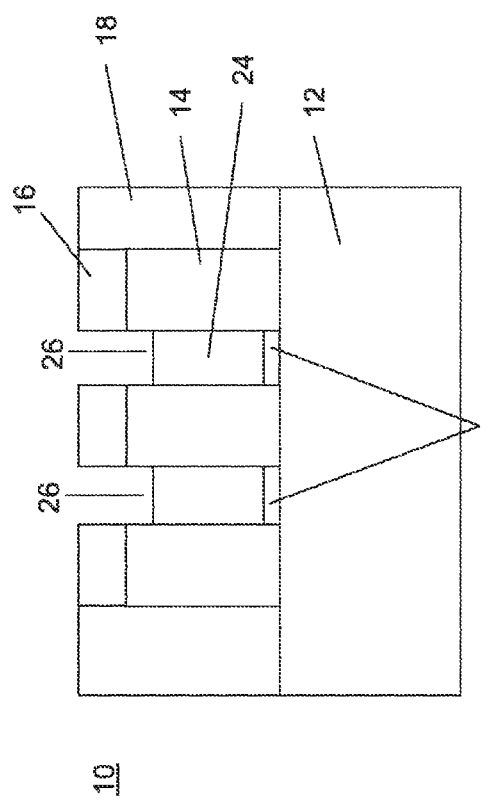
FIG. 5 is a cross-sectional view of the partially fabricated semiconductor device of FIG. 4 showing the second fins (e.g., SiGe) recessed to a target height in accordance with the present principles.

Referring to FIG. 5, the fins 24 may be recessed by a selective etch process or reactive ion etch (RIE) process. The recess of the fins 24 provides control of the fin height. The fins 24 are recessed by a recess amount 26 to form the fins 24 to a target fin height. While the height of the fins 24 is controlled using a recess process, in accordance with the present principles, there is no limit on the fin height. The trenches 15 may be formed to any depth and width in the substrate 12 resulting in a taller fin 24, if desired.

Figure 6:
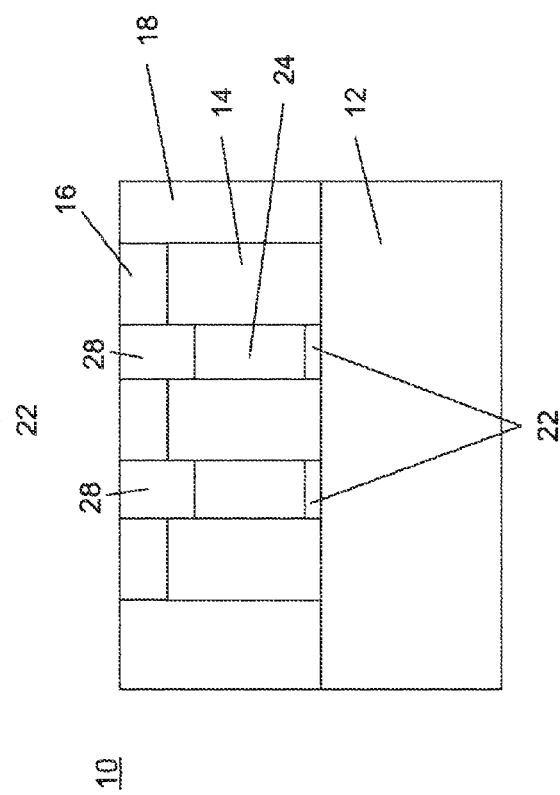
FIG. 6 is a cross-sectional view of the partially fabricated semiconductor device of FIG. 5 showing a second dielectric layer formed on the second fins in accordance with the present principles.

Referring to FIG. 6, a dielectric fill 28 is applied over the device 10. The dielectric fill 28 may include a flowable oxide material or other oxide material (e.g., $SiO_2$). The dielectric fill 28 fills in gaps and spaces between fins 14 and above fins 24. The dielectric fill 28 is then removed from the top of the gate structures 16 by a planarizing process, such as a CMP process.

Figure 7:
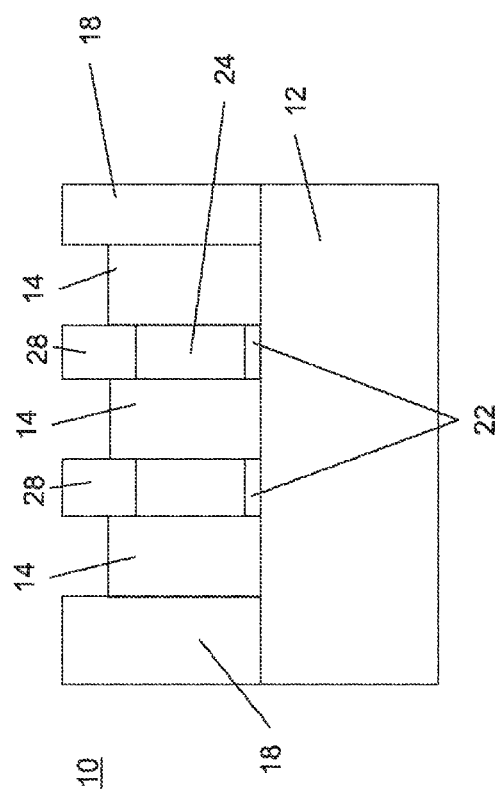
FIG. 7 is a cross-sectional view of the partially fabricated semiconductor device of FIG. 6 showing the hardmask removed to expose the first fins in accordance with the present principles.

Referring to FIG. 7, the hardmask 16, which was exposed by the CMP is removed by a selective etch. The selective etch removes the hardmask 16 relative to the dielectric fill 18, dielectric fill 28 and eventually fins 14. The hardmask 16 is removed to expose the fins 14.

Figure 8:
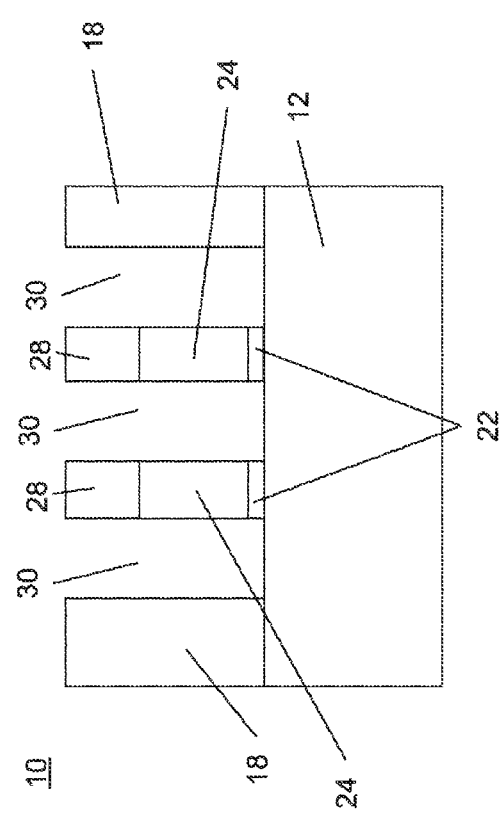
FIG. 8 is a cross-sectional view of the partially fabricated semiconductor device of FIG. 7 showing the first fins removed by a selective etch process in accordance with the present principles.

Referring to FIG. 8, the dielectric fill 28 provides etch protection for a reactive ion etch (RIE) process. The RIE process is employed to remove the fins 14 to expose the substrate 12. A selective etch removal of the fins 14 can be also employed.

Referring to FIG. 9, another dielectric layer 32 is deposited to bury the fins 24. The dielectric layer 32 may include an oxide material, although other dielectric materials may be employed. The dielectric layer 32 is deposited to form a shallow trench isolation (STI) region in later steps. Further processing of the fins 24 includes recessing the dielectric layer 32 to expose the fins 24, forming gate structures (e.g., dummy gate structures or metal gate structures depending on the application) over the fins 24, growing source and drain regions on the fins 24, forming contacts and metallizations to complete the finFETs, etc.

The fins 24 may include, as grown, monocrystalline SiGe to form a channel for a finFETs. The fins 24 may include a high percentage of Ge, e.g., 10% to about 100% (pure Ge). The fins 24 may include a width or height of between about 10 nm to about 50 nm, although other thicknesses and heights may be employed. The width of the fin may be increased by growing the fins between other fins. This increases the ability to customize the pitch and width of the fins 24 making longer channel lengths or providing different channel lengths according to the fin widths. In addition, the height of the fins 24 is not limited as deeper trenches may be formed using fins 14 to control the height. The confined formation of the fins 24 also provides facet free growth since the growth is confined between fins 14. Facet free refers to a SiGe material that does not include faceted surfaces or structure outgrowths. Therefore, the fins 24 are more uniform in their composition.

Referring to FIG. 10, a semiconductor device 50 includes a monocrystalline substrate 12. The substrate 12 preferably includes a bulk silicon substrate. Fins 24 are formed as described herein. The fins 24 are monocrystalline and defect free as the fins 24 are grown laterally using the substrate 12 as a seed layer as described above with reference to FIG. 4. A dielectric pad 22 is formed between a footprint of each fin 24 and the substrate 12 to provide electrical isolation between the fins 24 and the substrate 12. The dielectric pad 22 includes a same footprint as its corresponding SiGe fin 24.

The SiGe fins 24 are formed on the dielectric pad 22, and the dielectric pad 22 may include silicon oxide deposited before the SiGe fins 24 are grown. The fins 24 form a channel for fin field effect transistor devices 58. The SiGe fins 24 include a germanium concentration of greater than 50%, and more preferably greater than about 70%. In one embodiment, the SiGe fins 24 have a width of 10 nm or less and have a height of greater than 30 nm. The SiGe fins 24 have no limit on their height dimension.

Gate structures 52 are formed transversely over the fins 24. Source and drain regions 54 are formed and are preferably grown on the fins 24. The fins 24 may be formed with different pitches and/or different widths between adjacent fins 24.

Figure 11:
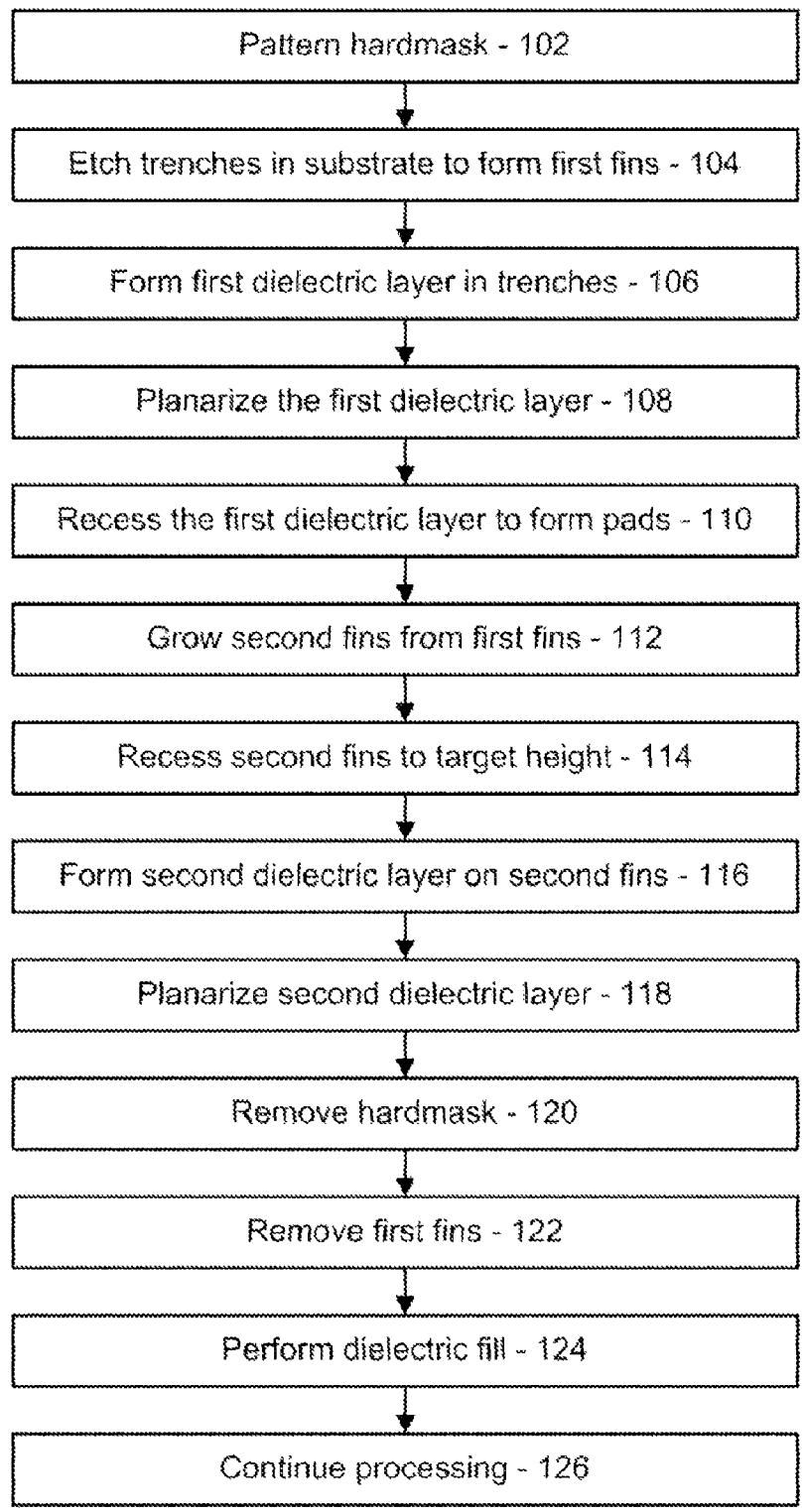
FIG. 11 is a block/flow diagram showing methods for forming a semiconductor device in accordance with illustrative embodiments.

Referring to FIG. 11, methods for forming fins on a semiconductor device are illustratively shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a hardmask is patterned on a monocrystalline substrate. The hardmask may include silicon nitride. The hardmask may be lithographically patterned. In block 104, trenches are etched into the substrate through the hardmask and in accordance with the pattern of the hardmask to form first fins. The patterning of the hardmask controls a width and pitch of second fins, as will be described. In block 106, a first dielectric layer is formed over the hardmask and in the trenches. In block 108, the first dielectric layer is planarized, stopping on the hardmask. In block 110, the first dielectric layer is recessed into the trenches to form a dielectric pad at a bottom of the trenches and to expose sidewalls of the first fins.

In block 112, second fins are grown from a material having a different composition than the substrate. The second fins are grown on the sidewalls of the trenches. The second fins are preferably epitaxially grown and include a monocrystalline structure that is defect free. In one embodiment, the substrate includes silicon and the material having a different composition includes silicon germanium. The second fins are grown epitaxially from the sidewalls of the first fins to form monocrystalline silicon germanium fins. The silicon germanium includes a germanium concentration of greater than 50%, preferably greater than about 70%. In block 114, the second fins are recessed to achieve a target fin height. The fin height in accordance with the present principles is not limited as it is in conventional devices.

In block 116, a second dielectric layer is formed over the second fins. The second dielectric layer may include an oxide. The second dielectric layer is employed to protect the second fins when the first fins are removed. In block 118, the second dielectric layer is planarized, stopping on the hardmask. In block 120, the hardmask is removed. In block 122, the first fins are removed by selective etching. In block 124, a dielectric fill may be performed to bury the second fins for an anneal process or to form an STI region. The STI dielectric is recessed and processing continues by forming gates, source and drain regions, etc. to complete the finFETs in block 126. The dielectric pad remains to isolate the second fins from the substrate in a final structure.

Having described preferred embodiments for dielectric isolated SiGe fin on bulk substrate (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming fins on a semiconductor device, comprising:
    forming a first dielectric layer at bottoms of trenches in a substrate between first fins;
    growing second fins of a material having a different composition than the substrate on sidewalls of the trenches;
    recessing the second fins;
    forming a second dielectric layer over the recessed second fins; and
    removing the first fins by etching.

2. The method as recited in claim 1, further comprising etching the trenches into a monocrystalline substrate and patterning a hardmask on the substrate wherein the hardmask controls a width and pitch of the second fins.

3. The method as recited in claim 1, wherein forming the first dielectric layer includes filling the trenches with the first dielectric layer and recessing the first dielectric layer by etching to expose sidewalls of the first fins.

4. The method as recited in claim 1, wherein the substrate includes silicon and the material having a different composition includes silicon germanium and growing the second fins includes epitaxially growing the second fins to form monocrystalline silicon germanium fins.

5. The method as recited in claim 4, wherein the silicon germanium includes a germanium concentration of greater than 50%.

6. The method as recited in claim 1, wherein the recessing of the second fins achieves a target fin height.

7. The method as recited in claim 1, wherein the first dielectric layer is recessed to the bottoms of the trenches and remains to isolate the second fins from the substrate in a final structure.

8. A method for forming fins on a semiconductor device, comprising:
    forming a first dielectric layer over a hardmask and in trenches in a substrate between first tins;
    planarizing the first layer and stopping on the hardmask;
    recessing the first dielectric layer into the trenches to form a dielectric pad at a bottom of the trenches and to expose sidewalls of the first fins;
    growing second fins of a material having a different composition than the substrate on the sidewalk of the trenches;
    forming a second dielectric layer over the second fins;
    planarizing the second dielectric layer and stopping on the hardmask;
    removing the hardmask; and
    removing the first fins by etching.

9. The method as recited in claim 8, further comprising patterning a hardmask on a monocrystalline substrate, wherein the hardmask controls a width and pitch of the second fins.

10. The method as recited in claim 8, wherein the substrate includes silicon and the material having a different composition includes silicon germanium and growing the second fins includes epitaxially growing the second fins to form monocrystalline silicon germanium fins.

11. The method as recited in claim 10, wherein the silicon germanium includes a germanium concentration of greater than 50%.

12. The method as recited in claim 8, further comprising recessing the second fins to achieve a target fin height.

13. The method as recited in claim 8, wherein the dielectric pad remains to isolate the second fins from the substrate in a final structure.

* * * * *